(12) United States Patent
Wang et al.

(10) Patent No.: US 12,009,293 B2
(45) Date of Patent: Jun. 11, 2024

(54) BARRIER-FREE INTERCONNECT STRUCTURE AND MANUFACTURING METHOD THEREOF

(71) Applicant: Taiwan Semiconductor Manufacturing Co., Ltd., Hsinchu (TW)

(72) Inventors: Pei-Yu Wang, Hsinchu (TW); Cheng-Ting Chung, Hsinchu (TW); Wei Ju Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/693,925

(22) Filed: Mar. 14, 2022

(65) Prior Publication Data

US 2022/0199523 A1    Jun. 23, 2022

Related U.S. Application Data

(62) Division of application No. 16/572,670, filed on Sep. 17, 2019, now Pat. No. 11,276,637.

(51) Int. Cl.
*H01L 21/768* (2006.01)
*H01L 23/522* (2006.01)

(52) U.S. Cl.
CPC .... *H01L 23/5226* (2013.01); *H01L 21/76802* (2013.01); *H01L 21/76829* (2013.01); *H01L 21/7685* (2013.01); *H01L 21/76877* (2013.01)

(58) Field of Classification Search
CPC .................... H01L 21/76819; H01L 21/76829
See application file for complete search history.

(56) References Cited

U.S. PATENT DOCUMENTS

| | | |
|---|---|---|
| 6,207,554 B1 | 3/2001 | Xu |
| 6,326,293 B1 | 12/2001 | Fang |
| 9,520,362 B2 | 12/2016 | Lin et al. |
| 9,613,856 B1 | 4/2017 | Yang et al. |
| 9,716,032 B2 | 7/2017 | Tang et al. |
| 9,721,883 B1 | 8/2017 | Lai |
| 9,972,529 B2 | 5/2018 | Yang et al. |
| 10,163,691 B2 | 12/2018 | Shih et al. |
| 10,170,322 B1 | 1/2019 | Cheng et al. |
| 10,643,927 B1 | 5/2020 | Shank et al. |
| 10,727,122 B2 * | 7/2020 | Backes .............. H01L 21/2885 |
| 2004/0113238 A1 | 6/2004 | Hasunuma et al. |
| 2006/0088991 A1 | 4/2006 | Kim |
| 2006/0091559 A1 | 5/2006 | Nguyen et al. |
| 2006/0118962 A1 | 6/2006 | Huang et al. |
| 2006/0186548 A1 | 8/2006 | Enomoto et al. |
| 2006/0189133 A1 | 8/2006 | Dimitrakopoulos et al. |
| 2007/0075428 A1 | 4/2007 | Wang et al. |
| 2009/0134525 A1 | 5/2009 | Ma |
| 2009/0302477 A1 | 12/2009 | Shor et al. |
| 2010/0261345 A1 * | 10/2010 | Na .................... H01L 21/76897 |
| | | 257/E21.585 |

(Continued)

*Primary Examiner* — Jae Lee
(74) *Attorney, Agent, or Firm* — Haynes and Boone, LLP

(57) ABSTRACT

Semiconductor devices and method of forming the same are disclosed herein. A semiconductor device according to the present disclosure includes a first dielectric layer having a first top surface and a contact via extending through the first dielectric layer and rising above the first top surface of the first dielectric layer.

20 Claims, 16 Drawing Sheets

(56) References Cited

U.S. PATENT DOCUMENTS

| | | | |
|---|---|---|---|
| 2011/0021018 A1 | 1/2011 | Izawa | |
| 2013/0001796 A1* | 1/2013 | Song | H01L 21/76834 |
| | | | 257/774 |
| 2013/0292794 A1 | 11/2013 | Pai et al. | |
| 2014/0008815 A1* | 1/2014 | Park | H01L 21/76898 |
| | | | 257/774 |
| 2014/0159244 A1 | 6/2014 | Lu | |
| 2014/0183740 A1* | 7/2014 | Li | H01L 23/5384 |
| | | | 438/653 |
| 2014/0199838 A1* | 7/2014 | Na | H01L 21/02697 |
| | | | 438/675 |
| 2016/0225695 A1* | 8/2016 | Gandhi | H01L 21/76898 |
| 2016/0293519 A1* | 10/2016 | Gandhi | H01L 24/05 |
| 2019/0131228 A1 | 5/2019 | Chun | |
| 2020/0058544 A1* | 2/2020 | Chou | H01L 23/5226 |
| 2020/0098685 A1 | 3/2020 | Lee | |
| 2020/0144195 A1* | 5/2020 | Yang | H01L 23/5329 |
| 2020/0328131 A1* | 10/2020 | Marin | H01L 23/3128 |

* cited by examiner

BARRIER-FREE INTERCONNECT STRUCTURE AND MANUFACTURING METHOD THEREOF

PRIORITY

This application is a divisional application of U.S. patent application Ser. No. 16/572,670, filed Sep. 17, 2019, the entirety of which is incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, as multilayer interconnect (MLI) features become more compact with ever-shrinking IC feature size, interconnects of the MLI features are exhibiting increased parasitic resistance, which presents performance, yield, and cost challenges. It has been observed that higher parasitic resistances exhibited by interconnects in advanced IC technology nodes can cause significant resistive-capacitive delay (RC delay) that prevents signals from being routed efficiently to and from IC devices, such as transistors, negating any improvements in performance of such IC devices in the advanced technology nodes. Accordingly, although existing interconnects have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
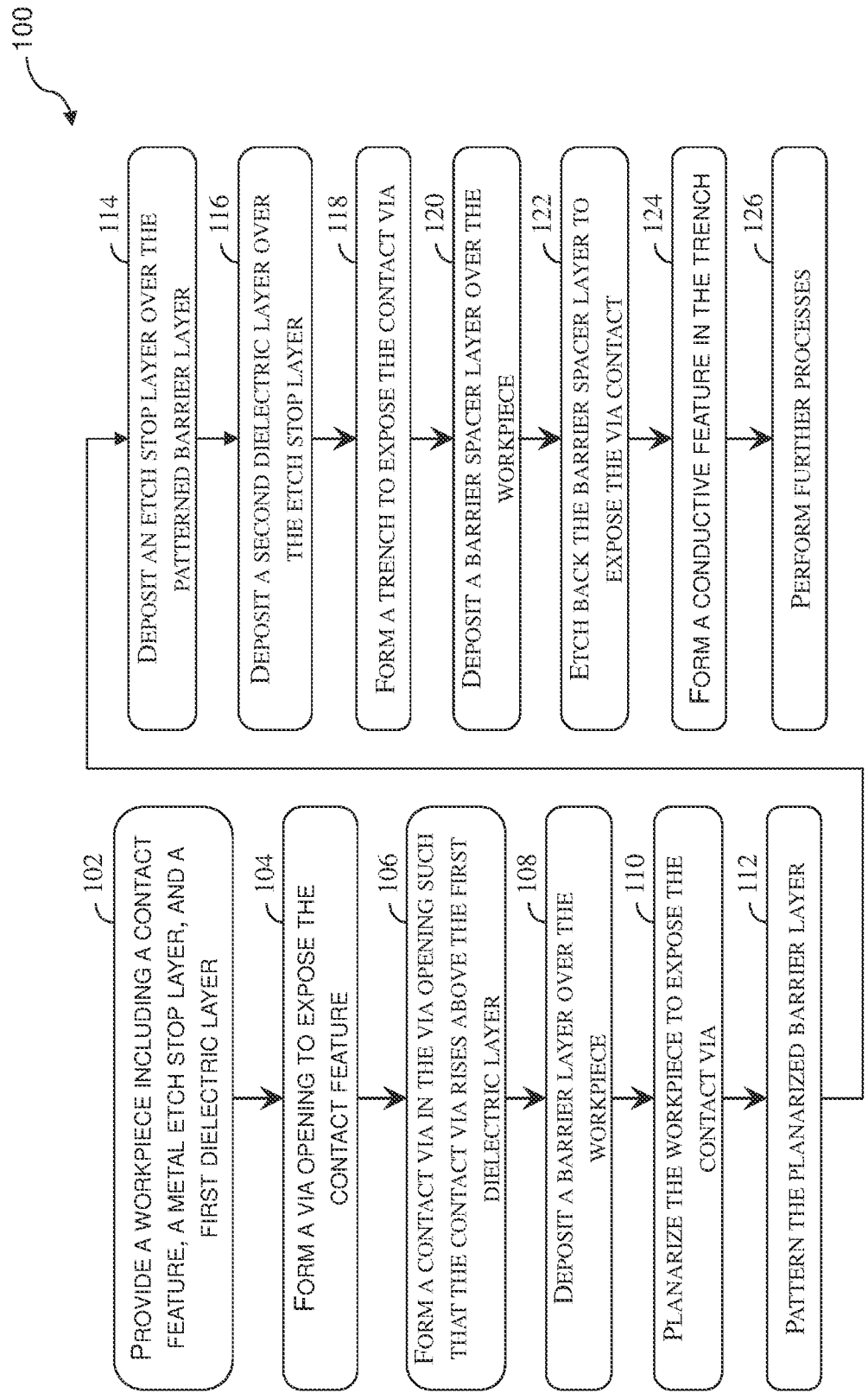
FIG. 1 is a flow chart of a method for fabricating an interconnect structure according to various aspects of the present disclosure.

The present disclosure relates generally to integrated circuit (IC) devices, and more particularly, to interconnect structures of IC devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

IC manufacturing process flow is typically divided into three categories: front-end-of-line (FEOL), middle-end-of-line (MEOL), and back-end-of-line (BEOL). FEOL generally encompasses processes related to fabricating IC devices, such as transistors. For example, FEOL processes can include forming isolation features, gate structures, and source and drain features (generally referred to as source/drain features). MEOL generally encompasses processes related to fabricating contacts to conductive features (or conductive regions) of the IC devices, such as contacts to the gate structures and/or the source/drain features. BEOL generally encompasses processes related to fabricating a multilayer interconnect (MLI) feature that interconnects IC features fabricated by FEOL and MEOL (referred to herein as FEOL and MEOL features or structures, respectively), thereby enabling operation of the IC devices.

As IC technologies progress towards smaller technology nodes, MEOL and BEOL processes are experiencing significant challenges. For example, advanced IC technology nodes require more compact MLI features, which requires significantly reducing critical dimensions of interconnects of the MLI features (for example, widths and/or heights of vias and/or conductive lines of the interconnects). The reduced critical dimensions have led to significant increases in interconnect resistance, which can degrade IC device performance (for example, by increasing resistance-capacitance (RC) delay). Simulations done on contact vias with widths ranging between about 10 nm and about 15 nm show that presence of a barrier layer at the interface can increase the resistance by about 30 ohm and about 50 ohm, in some instances, which translates into about 2% to 4% of reduction in speed. Several barrier-free via formation techniques have been proposed to replace conventional vias to lower interconnect resistance for advanced IC technology nodes. Although these conventional barrier-free via formation techniques are generally adequate for their purposes, they may require use of different material schemes or complicated processes that may result in increase in costs and/or less than optimal conductance.

The present disclosure discloses novel interconnect structures that have reduced parasitic resistance and sound barrier features that prevent metal and oxygen diffusion. In some embodiments of the present disclosure, the novel interconnect structure includes a contact via that extends through a first dielectric layer and a barrier layer disposed over the first dielectric layer. In that regard, a top surface of the contact via rises above a top surface of the first dielectric layer. An etch stop layer and a second dielectric layer are disposed over the first dielectric layer and the barrier layer. A portion of the barrier layer extends between the first dielectric layer and the etch stop layer. A conductive feature extends through the etch stop layer and the second dielectric layer to be in contact with the top surface of the contact via. A barrier spacer is disposed between the conductive feature, on the one hand, and the etch stop layer and the second dielectric layer, on the other. The conductive feature is allowed direct contact with the contact via while the barrier layer and the barrier spacer collectively surround the conductive feature to guard against unwanted diffusion. Different embodiments may have different advantages, and no particular advantage is required of any embodiment.

FIG. 1 illustrate a flow chart of a method 100 for fabricating an interconnect structure of a semiconductor device according to various aspects of the present disclosure. FIGS. 2-4, 5A-5D and 6-14 are fragmentary cross-sectional views of an interconnect structure of a semiconductor device at various stages of fabrication according to various embodiments of method 100 of the present disclosure. Additional steps can be provided before, during, and after method 100, and some of the steps described can be moved, replaced, or eliminated for additional embodiments of method 100. Additional features can be added in the interconnect structure depicted in FIGS. 2-4, 5A-5D and 6-14, and some of the features described below can be replaced, modified, or eliminated in other embodiments of the interconnect structure depicted in FIGS. 2-4, 5A-5D and 6-14.

Figure 2:
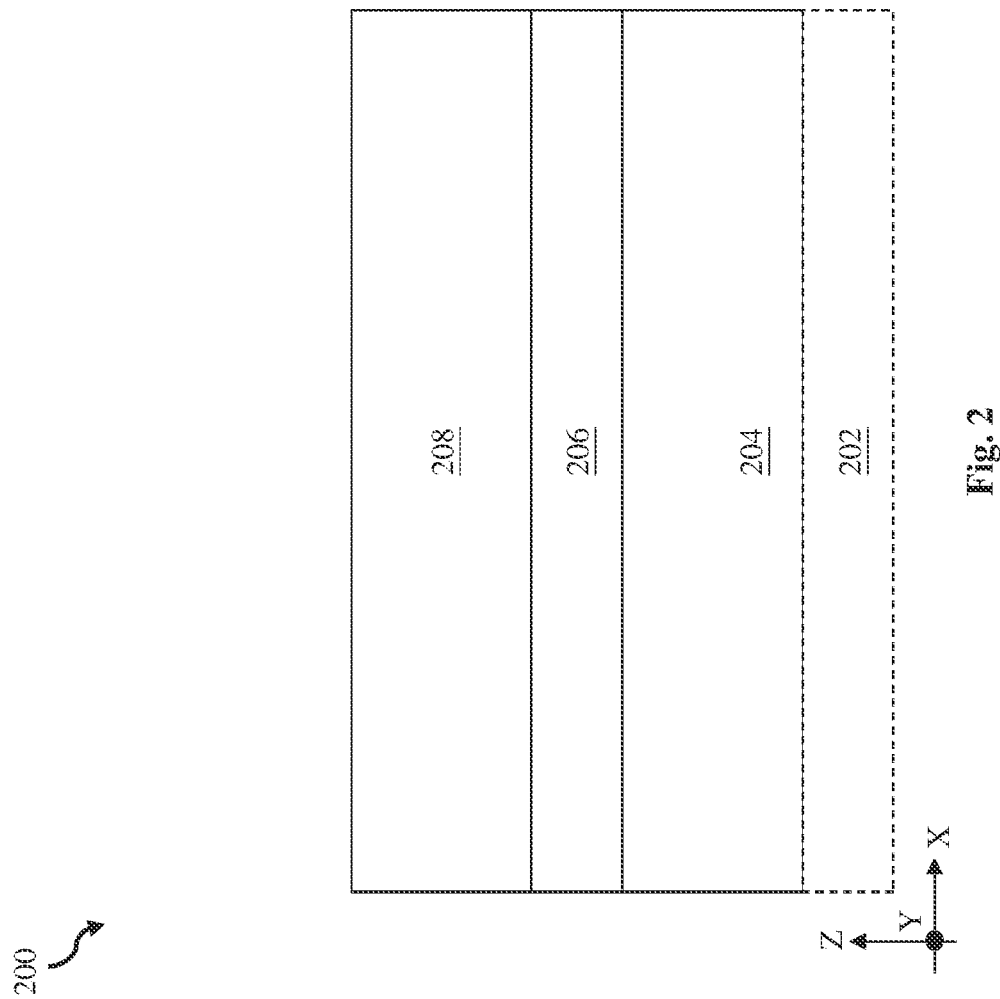
FIGS. 2-4, 5A-5D and 6-16 are fragmentary cross-sectional and top views of an interconnect structure of a semiconductor device at various stages of fabrication, according to various aspects of the present disclosure.

Referring to FIGS. 1 and 2, the method 100 includes a block 102 where a workpiece 200 that includes a contact feature 204, a metal etch stop layer (MESL) 206, and a first dielectric layer 208 is provided. As the workpiece 200 will become a semiconductor device upon conclusion of the method 100 and further processes, if necessary, the workpiece 200 may also be herein referred to as the semiconductor device 200. The semiconductor device 200 can be included in a microprocessor, a memory, and/or other IC device. In some implementations, the semiconductor device is a portion of an IC chip, a system on chip (SoC), or portion thereof, that includes various passive and active microelectronic devices, such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. The transistors may be planar transistors or multi-gate transistors, such as fin-like FETs (FinFETs) and gate-all-around (GAA) transistors. FIG. 2 has been simplified for the sake of clarity to better understand the inventive concepts of the present disclosure. Additional features can be added in the workpiece 200 (semiconductor device 200), and some of the features described below can be replaced, modified, or eliminated in other embodiments of the workpiece 200 (semiconductor device 200).

The workpiece 200 in FIG. 2 includes a substrate (wafer) 202. In the depicted embodiment, substrate 202 includes silicon. Alternatively or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. In some implementations, substrate 202 includes one or more group III-V materials, one or more group II-IV materials, or combinations thereof. In some implementations, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 202 can include various doped regions (not shown) configured according to design requirements of semiconductor device 200, such as p-type doped regions, n-type doped regions, or combinations thereof. P-type doped regions (for example, p-type wells) include p-type dopants, such as boron, indium, other p-type dopant, or combinations thereof. N-type doped regions (for example, n-type wells) include n-type dopants, such as phosphorus, arsenic, other n-type dopant, or combinations thereof. In some implementations, substrate 202 includes doped regions formed with a combination of p-type dopants and n-type dopants. The various doped regions can be formed directly on and/or in substrate 202, for example, providing a p-well structure, an n-well structure, a dual-well structure, a raised structure, or combinations thereof. An ion implantation process, a diffusion process, and/or other suitable doping process can be performed to form the various doped regions. For simplicity, the substrate 202 is not illustrated in FIGS. 3, 4, 5A-5D and 6-14.

An isolation feature(s) (not shown) is formed over and/or in substrate 202 to isolate various regions, such as various device regions, of semiconductor device 200. For example, isolation features define and electrically isolate active device regions and/or passive device regions from each other. Isolation features include silicon oxide, silicon nitride, silicon oxynitride, other suitable isolation material, or combinations thereof. Isolation features can include different structures, such as shallow trench isolation (STI) structures, deep trench isolation (DTI) structures, and/or local oxidation of silicon (LOCOS) structures. In some implementations, isolation features include STI features. For example, STI features can be formed by etching a trench in substrate 202 (for example, by using a dry etch process and/or wet etch process) and filling the trench with insulator material (for example, by using a chemical vapor deposition (CVD) process or a spin-on glass process). A chemical mechanical polishing (CMP) process may be performed to remove excessive insulator material and/or planarize a top surface of isolation features. In some embodiments, STI features include a multi-layer structure that fills the trenches, such as a silicon nitride layer disposed over an oxide liner layer.

While not shown, various gate structures are disposed over the substrate 202 and one or more of them interpose a source region and a drain region, where a channel region is defined between the source region and the drain region. The one or more gate structures engage the channel region, such that current can flow between the source/drain regions during operation. In some implementations, gate structures are formed over a fin structure, such that gate structures each wrap a portion of the fin structure. For example, one or more of gate structures wrap channel regions of the fin structure, thereby interposing source regions and drain regions of the fin structure. In some embodiments, gate structures include metal gate (MG) stacks that are configured to achieve desired functionality according to design requirements of the semiconductor device 200. In some implementations, metal gate stacks include a gate dielectric and a gate electrode over the gate dielectric. The gate dielectric includes a dielectric material, such as silicon oxide, high-k dielectric material, other suitable dielectric material, or combinations thereof. High-k dielectric material generally refers to dielectric materials having a high dielectric constant, for example, greater than a dielectric constant of silicon oxide (k≈3.9). Exemplary high-k dielectric materials include hafnium, aluminum, zirconium, lanthanum, tantalum, titanium, yttrium, oxygen, nitrogen, other suitable constituent, or combinations thereof. In some implementations, the gate dielectric includes a multilayer structure, such as an interfacial layer including, for example, silicon oxide, and a high-k dielectric layer including, for example, $HfO_2$, HfSiO, HfSiON, HfTaO, HfSiO, HfZrO, $ZrO_2$, $Al_2O_3$, $HfO_2$-$Al_2O_3$, $TiO_2$, $Ta_2O_5$, $La_2O_3$, $Y_2O_3$, other suitable high-k dielectric material, or combinations thereof. The gate electrode includes an electrically conductive material. In some implementations, the gate electrode includes multiple layers, such as one or more capping layers, work function layers, glue/barrier layers, and/or metal fill (or bulk) layers. A capping layer can include a material that prevents or eliminates diffusion and/or reaction of constituents between the gate dielectric and other layers of the gate electrode. In some implementations, the capping layer includes a metal and nitrogen, such as titanium nitride (TiN), tantalum nitride (TaN), tungsten nitride ($W_2N$), titanium silicon nitride (TiSiN), tantalum silicon nitride (TaSiN), or combinations thereof. A work function layer includes a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. A glue/barrier layer can include a material that promotes adhesion between adjacent layers, such as the work function layer and the metal fill layer, and/or a material that blocks and/or reduces diffusion between gate layers, such as such as the work function layer and the metal fill layer. For example, the glue/barrier layer includes metal (for example, W, Al, Ta, Ti, Ni, Cu, Co, other suitable metal, or combinations thereof), metal oxides, metal nitrides (for example, TiN), or combinations thereof. A metal fill layer can include a suitable conductive material, such as Al, W, and/or Cu.

Epitaxial source features and epitaxial drain features (referred to as epitaxial source/drain features) may be disposed in source/drain regions of substrate 202. Gate structure and epitaxial source/drain features form a portion of a transistor of the semiconductor device 200. Gate structure and/or epitaxial source/drain features are thus alternatively referred to as device features. In some implementations, epitaxial source/drain features wrap source/drain regions of a fin structure. An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. Epitaxial source/drain features may be doped with n-type dopants and/or p-type dopants. In some implementations, where the transistor is configured as an n-type device (for example, having an n-channel), epitaxial source/drain features can be silicon-containing epitaxial layers or silicon-carbon-containing epitaxial layers doped with phosphorous, other n-type dopant, or combinations thereof (for example, forming Si:P epitaxial layers or Si:C:P epitaxial layers). In some implementations, where the transistor is configured as a p-type device (for example, having a p-channel), epitaxial source/drain features can be silicon-and-germanium-containing epitaxial layers doped with boron, other p-type dopant, or combinations thereof (for example, forming Si:Ge:B epitaxial layers). In some implementations, annealing processes are performed to activate dopants in epitaxial source/drain features of the semiconductor device 200.

In some implementations, silicide layers are formed on epitaxial source/drain features. In some implementations, silicide layers are formed by depositing a metal layer over epitaxial source/drain features. The metal layer includes any material suitable for promoting silicide formation, such as nickel, platinum, palladium, vanadium, titanium, cobalt, tantalum, ytterbium, zirconium, other suitable metal, or combinations thereof. The semiconductor device 200 is then heated (for example, subjected to an annealing process) to cause constituents of epitaxial source/drain features (for example, silicon and/or germanium) to react with the metal. The silicide layers thus include metal and a constituent of epitaxial source/drain features (for example, silicon and/or germanium). In some implementations, the silicide layers include nickel silicide, titanium silicide, or cobalt silicide. Any un-reacted metal, such as remaining portions of the metal layer, is selectively removed by any suitable process, such as an etching process.

Referring still to FIG. 2, in some embodiments, the contact feature 204 may represent an MEOL device-level contacts, such as gate contacts electrically coupled to gate structures and/or source/drain contacts electrically coupled to the epitaxial source/drain features. In some other embodiments, the contact feature 204 may represent a BEOL contact feature that may be a metal line in an interconnect structure. Although not shown, in some implementations, the contact feature 204 may include a barrier layer, a liner and a metal fill layer. The barrier layer may be formed of Ta, TaN, TaC, Ti, TiN, TiC, and other suitable material that can block oxygen diffusion. The liner may be formed of suitable metal, metal nitride, or metal carbide, such as Co, CoN and RuN. The metal fill layer may be formed of any suitable conductive material, such as W, Ni, Ta, Ti, Al, Cu, Co, TaN, TiN, Ru, and/or other suitable conductive materials. In embodiments where the contact feature 204 represents a BEOL contact feature in an interconnect structure, the interconnect structure may be electrically coupled various devices (for example, transistors, resistors, capacitors, and/or inductors) and/or components (for example, gate structures and/or source/drain features) of the semiconductor device 200, such that the various devices and/or components can operate as specified by design requirements of the semiconductor device 200. The interconnect structure includes a combination of dielectric layers and electrically conductive layers (for example, metal layers) configured to form various interconnect structures. The conductive layers are configured to form vertical interconnect features (providing, for example, vertical connection between features and/or vertical electrical routing), such as contacts and/or vias, and/or horizontal interconnect features (providing, for example, horizontal electrical routing), such as conductive lines (or metal lines). Vertical interconnect features typically connect horizontal interconnect features in different layers the interconnect structure. During operation, the interconnect features are configured to route signals between the devices and/or the components of the semiconductor device 200 and/or distribute signals (for example, clock signals, voltage signals, and/or ground signals) to the devices and/or the components of the semiconductor device 200. The present disclosure contemplates interconnect structures that include a plurality of dielectric layers and/or conductive layers.

The metal etch stop layer 206 is deposited over the contact feature 204 and is planarized to provide a level surface. In some embodiments, the metal etch stop layer 206 may be formed of a dielectric material that etches at a slower rate than the contact feature 204 as well as the first dielectric layer 208. The metal etch stop layer 206 therefore can provide control of the etch process to etch through the first dielectric layer 208 and the metal etch stop layer 206. In some implementations, the metal etch stop layer 206 may be formed of silicon nitride, silicon oxide, a combination thereof, or other suitable dielectric materials. The first dielectric layer 208 is deposited over the metal etch stop layer and is planarized to provide a top surface 209 for further processing. In some instances, the first dielectric layer 208 is an interlayer dielectric layer (ILD) or is one of the interlayer dielectric layers. The first dielectric layer 208 may be formed of silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, California), Xerogel, Aerogel, amorphous fluorinated carbon, Parylene, BCB, SiLK (Dow Chemical, Midland, Michigan), polyimide, other low-k dielectric material, or combinations thereof. In some embodiments, the composition of the first dielectric layer 208 is different from the composition of the metal etch stop layer 206 such that the metal etch stop layer 206 is able to slow down a subsequent etching process and provide control to such process. In some embodiments, the metal etch stop layer 206 may be formed by atomic layer deposition (ALD) or chemical vapor deposition (CVD) and the first dielectric layer 208 may be formed by flowable CVD (FCVD) or spin-on coating.

Figure 3:
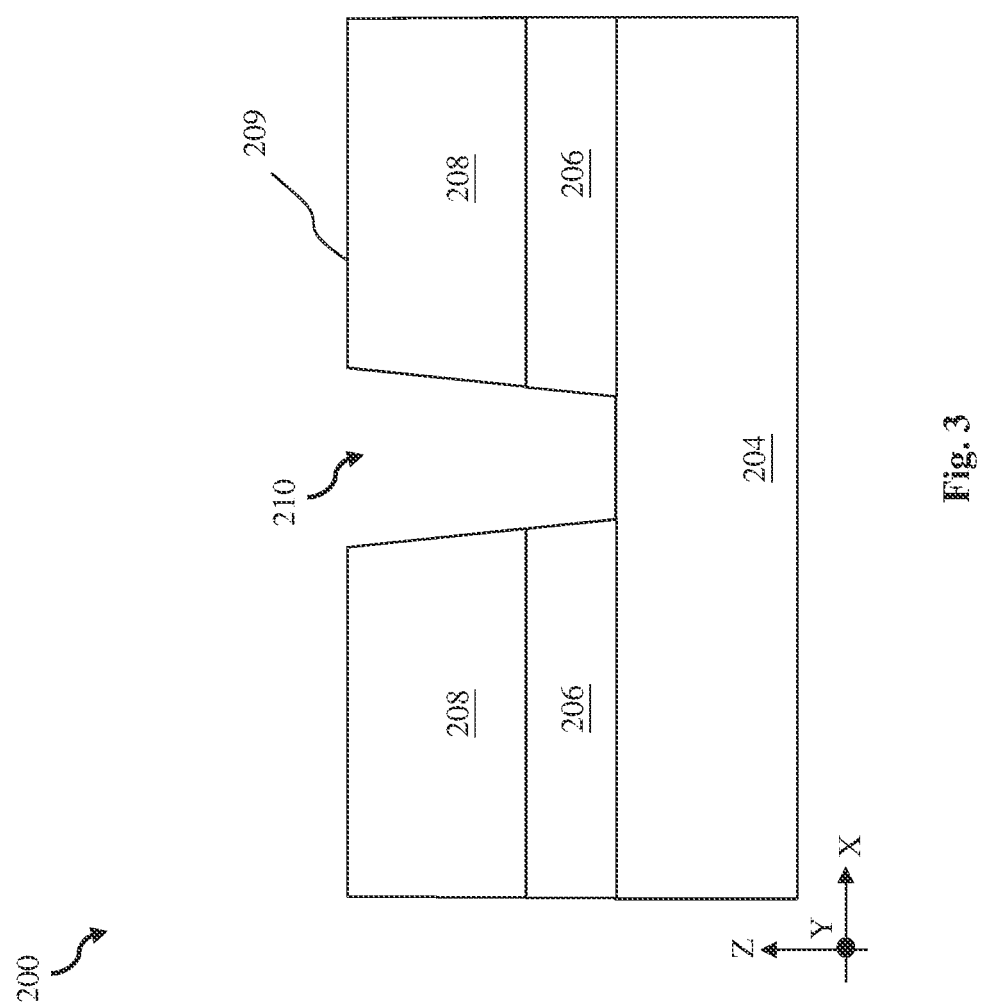

Referring to FIGS. 1 and 3, the method 100 includes a block 104 where a via opening 210 is formed to expose the contact feature 204. In some embodiments, photolithography techniques and anisotropic etching may be used to form the via opening 210. For example, a single-layer or a multilayer hard mask may be first formed over the top surface 209 of the first dielectric layer 208. Then the one or more photoresist layer may be deposited over the hard mask. The one or more photoresist layer may be then exposed to a patterned radiation reflected from or pass through a photolithography mask. After a post-exposure bake process, the exposed/unexposed portion of the photoresist layer may be removed in a developing process to form a patterned photoresist layer. The hard mask is then etched using the patterned photoresist layer as an etch mask to form a patterned hard mask. The first dielectric layer 208 and the metal etch stop layer 206 may then be anisotropically etched using the patterned hard mask as an etch mask to form the via opening 210 as shown in FIG. 3. In some embodiments, the anisotropic etch process may be a dry etch process, a wet etch process, or a suitable etch process. An example of the dry etch process may be a reactive ion etching (RIE) process. A portion of the contact feature 204 is exposed at the bottom of the via opening 210.

Figure 4:
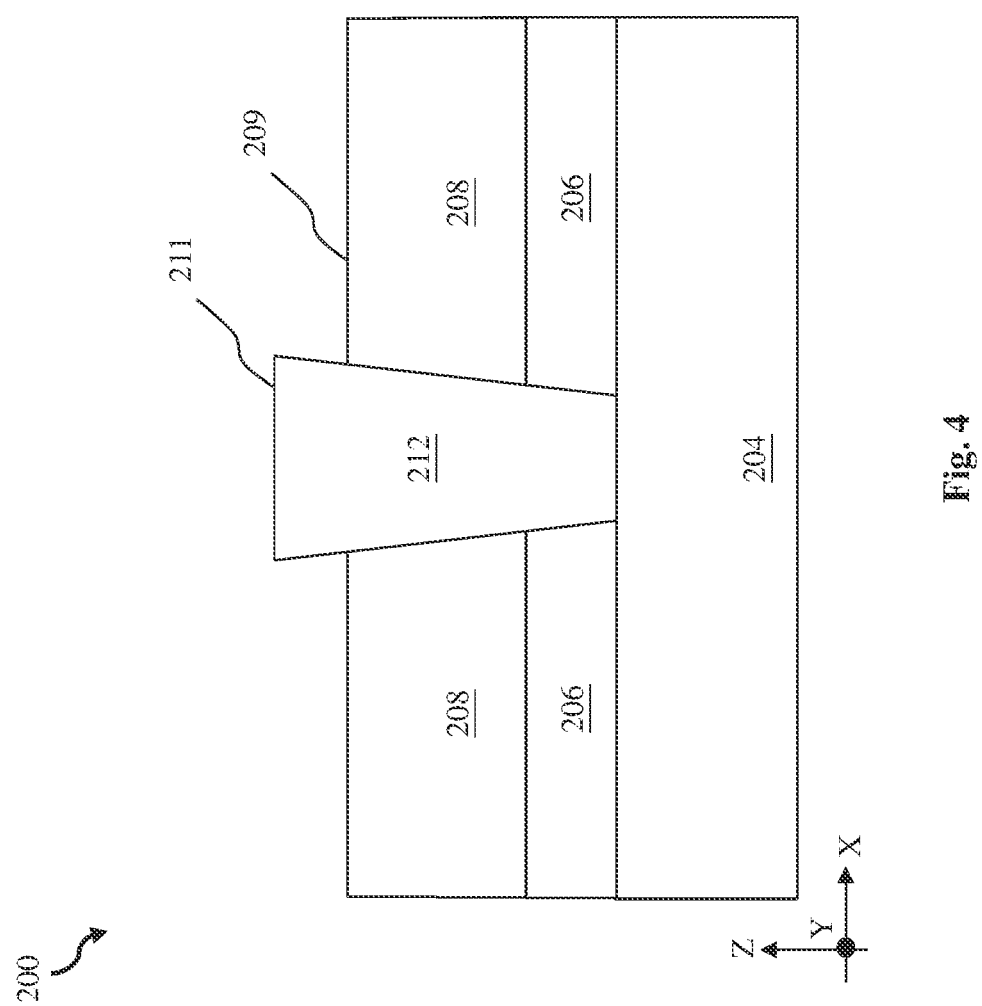

Referring to FIGS. 1 and 4, the method 100 includes a block 106 where a contact via 212 is formed in the via opening 210 such that the contact via 212 rises above the first dielectric layer 208. Upon conclusion of block 106, the contact via 212 is electrically coupled to the exposed portion of the contact feature 204 and extend along the Z direction through the metal etch stop layer 206 and the first dielectric layer 208. As illustrated in FIG. 4, the contact via 212 has a top surface 211 that is higher than the top surface 209 of the first dielectric layer 208. While not shown, a barrier layer may be formed between the contact via 212, on the one hand, and the metal etch stop layer 206 and the first dielectric layer 208, on the other. The barrier layer may be formed of a metal, a nitrogen-containing material, a metal nitride or a metal carbide, such as tantalum, tantalum nitride, tantalum carbide, titanium, titanium nitride, or titanium carbide, or a combination thereof. In some alternative embodiments, no barrier layer is formed between the contact via 212 and the metal etch stop layer 206 and between the contact via 212 and the first dielectric layer 208. In some implementations, the contact via 212 is formed of tungsten, ruthenium, nickel, or cobalt. In one example, the contact via is formed of tungsten or ruthenium. Because the contact via 212 extends along a direction vertical to the workpiece 200 and interconnects different conductive features in the workpiece 200, the contact via 212 is a vertical interconnect structure and may be referred to as a vertical interconnect structure 212.

Figure 5:
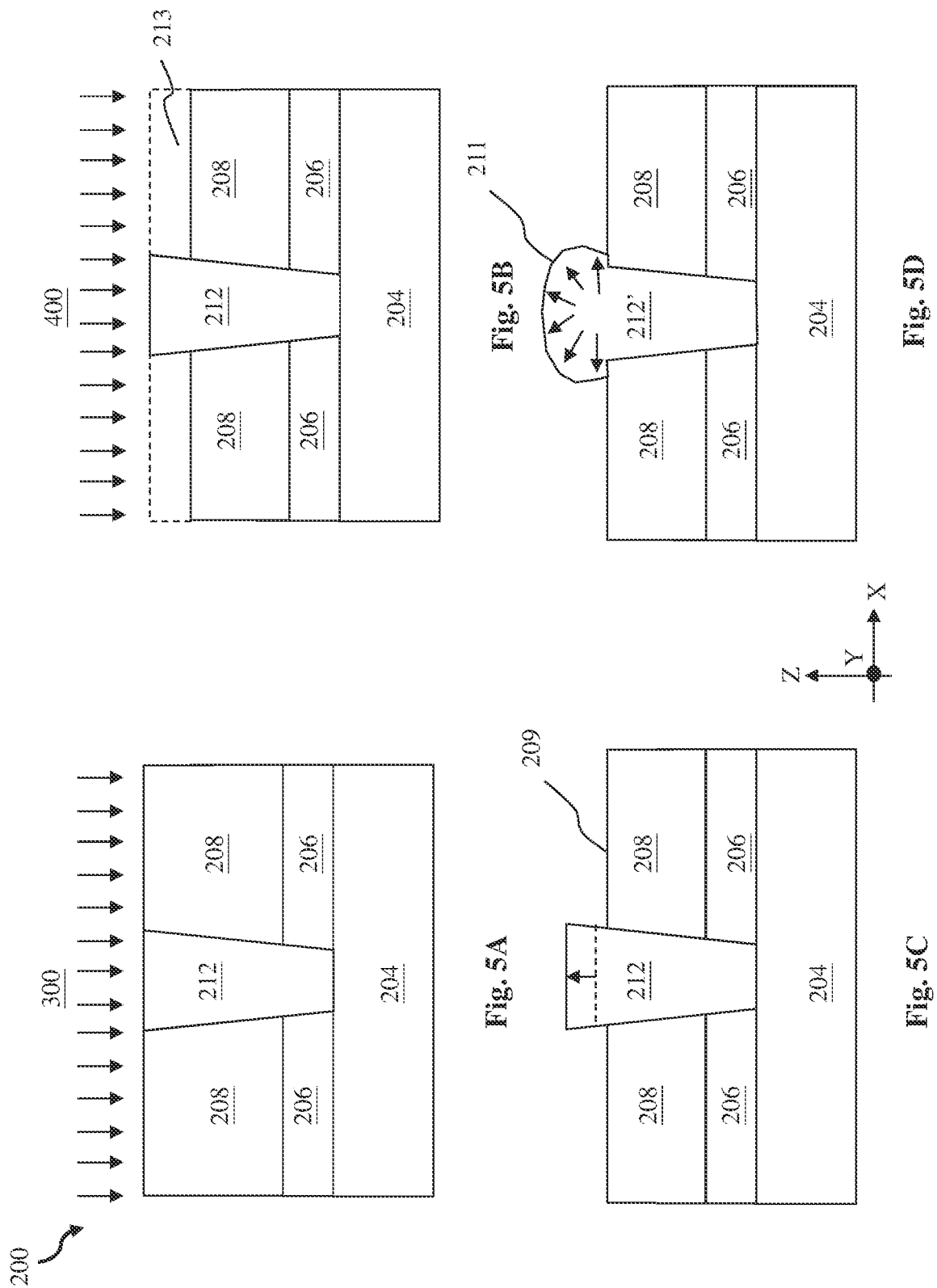

FIGS. 5A-5D illustrate various alternative processes to form the contact via 212 at block 106. Referring now to FIG. 5A, in some embodiments, the contact via 212 may be formed by depositing a via metal fill material in the via opening 210 (FIG. 3), planarizing the workpiece 200 to remove excess via metal fill material over the top surface of the first dielectric layer 208, and then selectively pulling back the first dielectric layer 208 until the contact via 212 protrudes from the top surface 209 of the first dielectric layer 208. In some implementations, the via metal fill material may be deposited using physical vapor deposition (PVD), chemical vapor deposition (CVD), atomic layer deposition (ALD), electroplating, electroless deposition (ELD) or other suitable deposition process, or combinations thereof. The planarization of the workpiece 200 may be performed by a suitable planarization technique, such as CMP; and the selective pull-back of the first dielectric layer 208 may be performed by an etch process 300 that selectively etches the first dielectric layer 208 while leaving the contact via 212 substantially unetched. In cases where the first dielectric layer 208 is formed of silicon oxide, the etch process 300 may be an etch process that is selective to silicon oxide. For example, the etch process 300 may be a dry etch process that includes use of fluorocarbons. Referring now to FIG. 5B, in some embodiments, the contact via 212 may be formed by depositing a sacrificial layer 213 over the first dielectric layer 208 before forming the via opening 210 at block 104, forming the via opening 210 through the metal etch stop layer 206, the first dielectric layer 208, and the sacrificial layer 213, depositing a via metal fill layer in the via opening 210, planarizing the workpiece 200 to remove excess via metal fill material over a top surface of the sacrificial layer 213, and then removing the sacrificial layer 213 in an etch process 400. Compared to the process illustrated in FIG. 5A, the sacrificial layer 213 is formed of a dielectric material that has an etch selectivity greater than the etch selectivity of the first dielectric layer 208.

Referring now to FIG. 5C, in some embodiments, the contact via 212 is deposited in the via opening 210 in a selective, self-aligned, and bottom-up fashion. In those embodiments, the via fill metal material for the contact via 212 is deposited by ALD or CVD, using one or more precursors that have a stronger affinity to metal surfaces. For example, when the contact via 212 is formed of tungsten, tungsten fluoride may be used as a precursor and when the contact via is formed of cobalt, dicobalt octacarbonyl, Bis(N-t-butyl-N'-ethylpropanimidamidato) cobalt(II), or carbonyl-hydrido-cobalt may be used as a precursor(s). The precursors preferentially attach to the exposed portion of the contact feature 204. In some implementations illustrated in FIG. 5C, the precursors for the via fill metal material may have a stronger affinity to a specific lattice plane of the exposed portion of the contact feature 204. In those implementations, the via fill metal material is deposited substantially along the Z direction and deposition continues after the contact via 212 rises above the top surface 209 of the first dielectric layer 208. In those implementations, the contact via 212 does not expand laterally along the X direction after it rises above the top surface 209 of the first dielectric layer 208. Referring now to FIG. 5D, in some embodiments, the contact via is also deposited in the via opening 210 in a selective, self-aligned, and bottom-up fashion. Compared to the process illustrated in FIG. 5C, the precursors of the deposition process to form the contact via 212 do not have a stronger affinity to any specific lattice plane of the exposed portion of the contact feature 204. As a result, after the lateral expansion is no longer restricted by sidewalls of the via opening 210, the contact via 212' may extend laterally along the X direction after it rises above the top surface 209 of the first dielectric layer 208. When the process illustrated in FIG. 5D is adopted, the contact via 212' may include a convex top surface 211 that includes portions disposed over the top surface 209 of the first dielectric layer 208. In some instances, the lateral expansion of the contact via 212' in FIG. 5D may be advantageous as it may increase contact area with conductive features formed over the contact via 212'.

Figure 6:
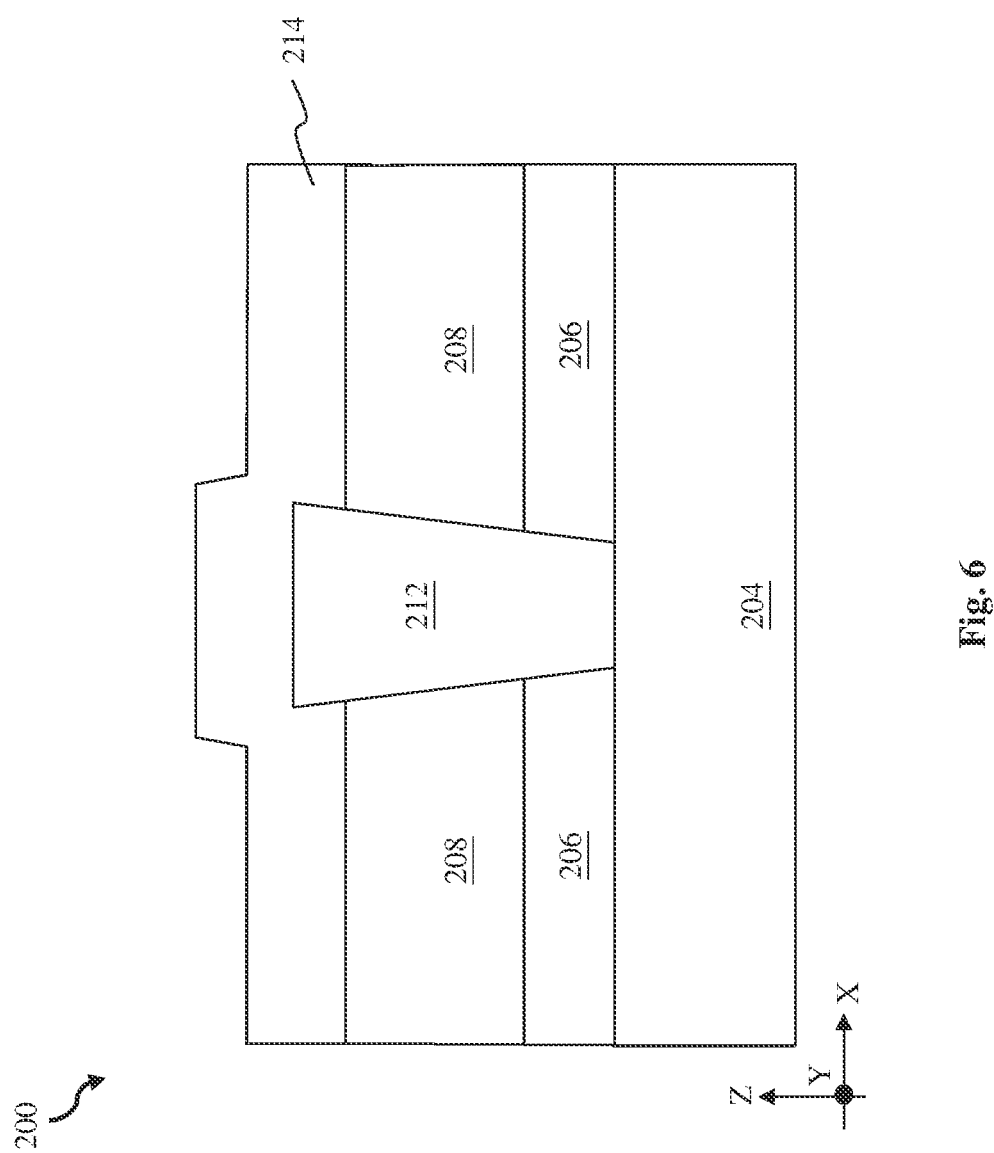

Referring to FIGS. 1 and 6, the method 100 includes a block 108 where a barrier layer 214 is deposited over the workpiece 200. In some embodiments, the barrier layer 214 may be deposited using CVD or ALD. The barrier layer 214 may be formed of a metal, a nitrogen-containing material, a metal nitride or a metal carbide, such as tantalum, tantalum nitride, tantalum carbide, titanium, titanium nitride, or titanium carbide, or a combination thereof. In some instances, the barrier layer 214 may consist essentially of tantalum nitride. In some embodiments, the barrier layer 214 completely cover the contact via 212 and the first dielectric layer 208.

Figure 7:
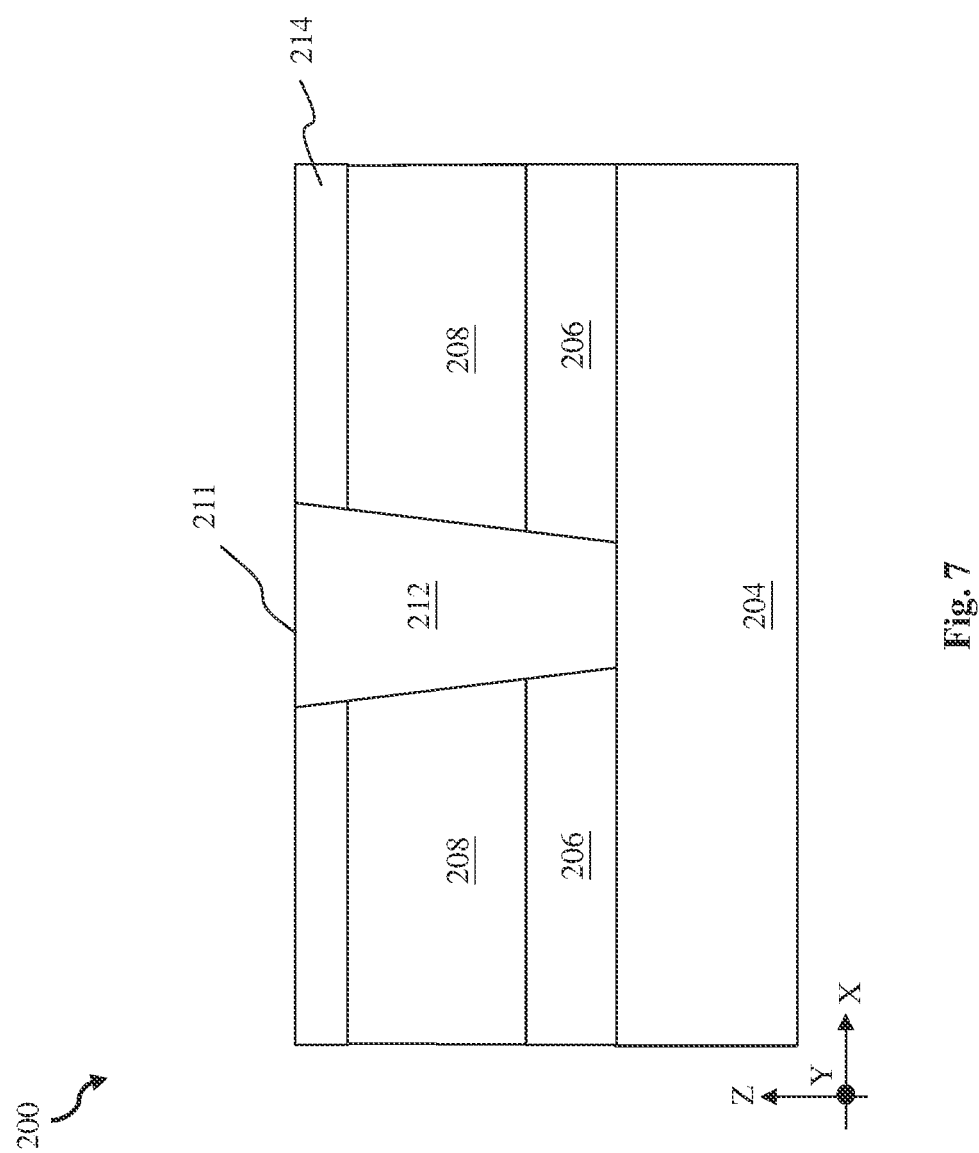

Referring to FIGS. 1 and 7, the method 100 includes a block 110 where the workpiece 200 is planarized to expose the contact via 212. In some embodiments, the workpiece 200 may be planarized by CMP to remove the barrier layer 214 over the contact via 212 to expose the top surface 211 of the contact via 212. It is noted that the planarization may also remove a portion of the contact via 212. In some embodiments illustrated in FIG. 7, after the planarization operations at block 110, the planarized barrier layer 214 has a first thickness T1 between about 1 nm and 5 nm. As the barrier layer 214 has a resistance higher than that of the contact via, reducing the first thickness T1 lowers resistance of the contact via 212. At the same time, the first thickness T1 may not be reduced below the foregoing thickness range or there may not be sufficient barrier layer 214 to block oxygen diffusion into the contact via 212 or metal diffusion from the contact via 212.

Figure 8:
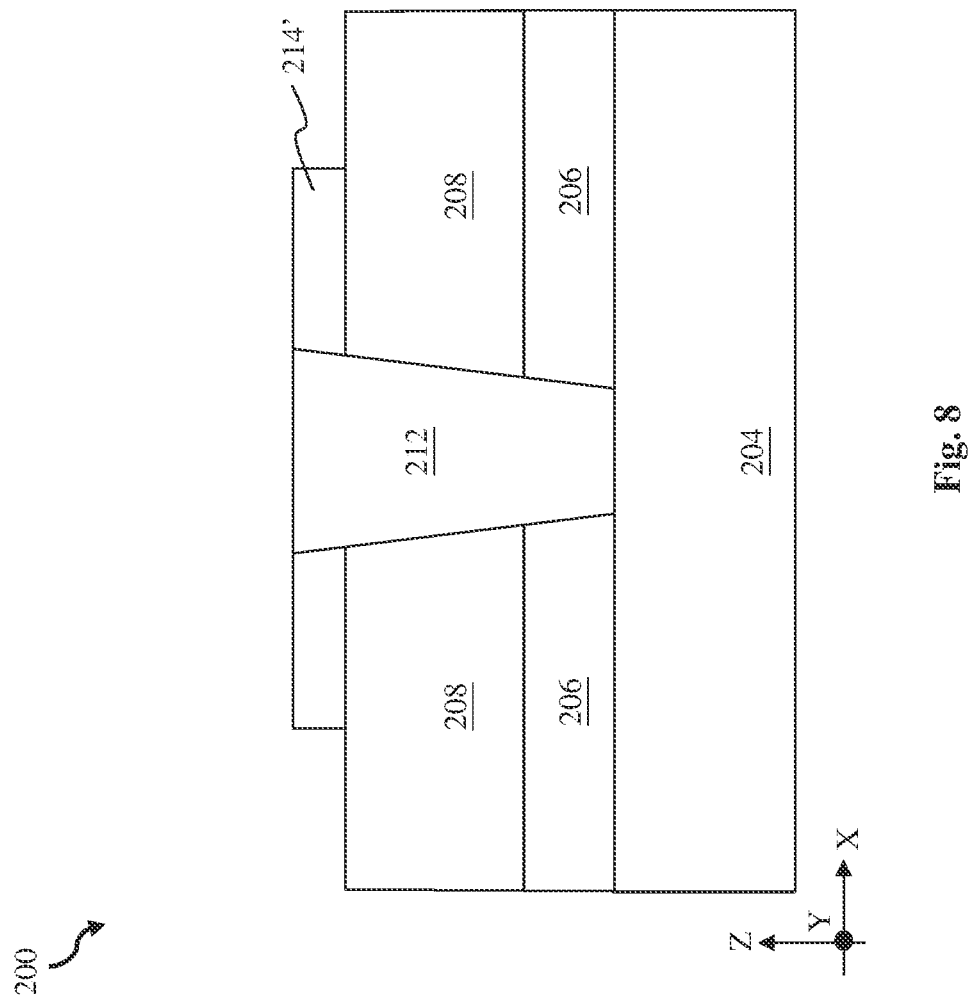

Referring to FIGS. 1 and 8, the method 100 includes a block 112 where the planarized barrier layer 214 is patterned. As the barrier layer 214 may be conductive and may cause shorts if allowed to extend over the first dielectric layer 208, the barrier layer 214 may be patterned to prevent unwanted electrically coupling with adjacent contact via, contact feature, or conductive features. In some embodiments, photolithography techniques and anisotropic etching may be used to pattern the barrier layer 214. For example, a single-layer or a multilayer hard mask may be first formed over the contact via 212 and the barrier layer 214. Then the one or more photoresist layer may be deposited over the hard mask. The one or more photoresist layer may be then exposed to a patterned radiation reflected from or pass through a photolithography mask. After a post-exposure bake process, the exposed/unexposed portion of the photoresist layer may be removed in a developing process to form a patterned photoresist layer. The hard mask is then etched using the patterned photoresist layer as an etch mask to form a patterned hard mask. The barrier layer 214 may then be anisotropically etched using the patterned hard mask as an etch mask to form the patterned barrier layer 214' in FIG. 8. In some embodiments, the anisotropic etch process may be a dry etch process, a wet etch process, or a suitable etch process. An example of the dry etch process may be a reactive ion etching (ME) process.

Figure 9:
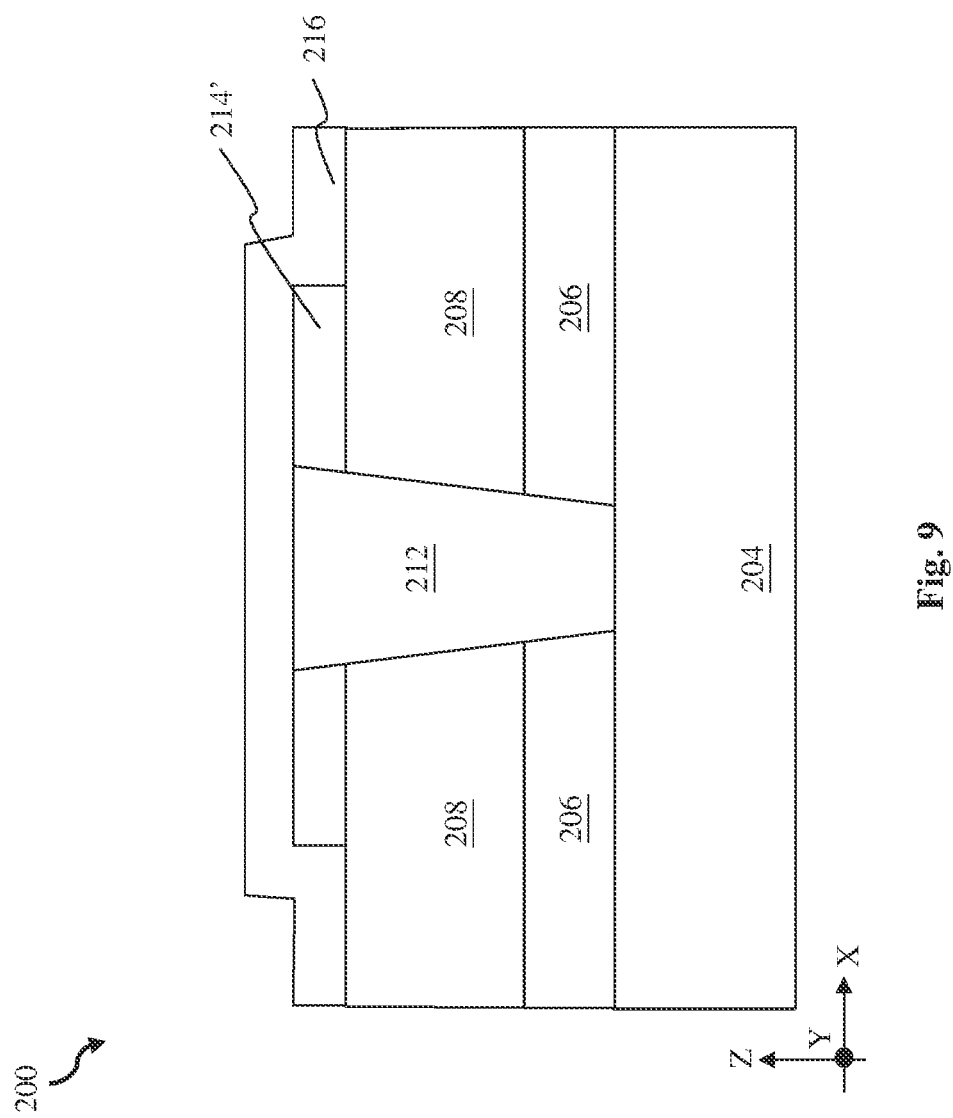

Referring to FIGS. 1 and 9, the method 100 includes a block 114 where an etch stop layer (ESL) 216 is disposed over the patterned barrier layer 214'. In some embodiments, the etch stop layer 216 may be formed of a dielectric material that etches at a slower rate than the contact via 212 as well as the second dielectric layer 218 (shown in FIG. 10) disposed over the etch stop layer 216. The etch stop layer 216 therefore can provide control of the etch process to etch through the second dielectric layer 218 and the etch stop layer 216. In some implementations, the etch stop layer 216 may be formed of silicon nitride, silicon oxide, a combination thereof, or other suitable dielectric materials. In some embodiments, the etch stop layer 216 may be formed by atomic layer deposition (ALD) or chemical vapor deposition (CVD).

Figure 10:
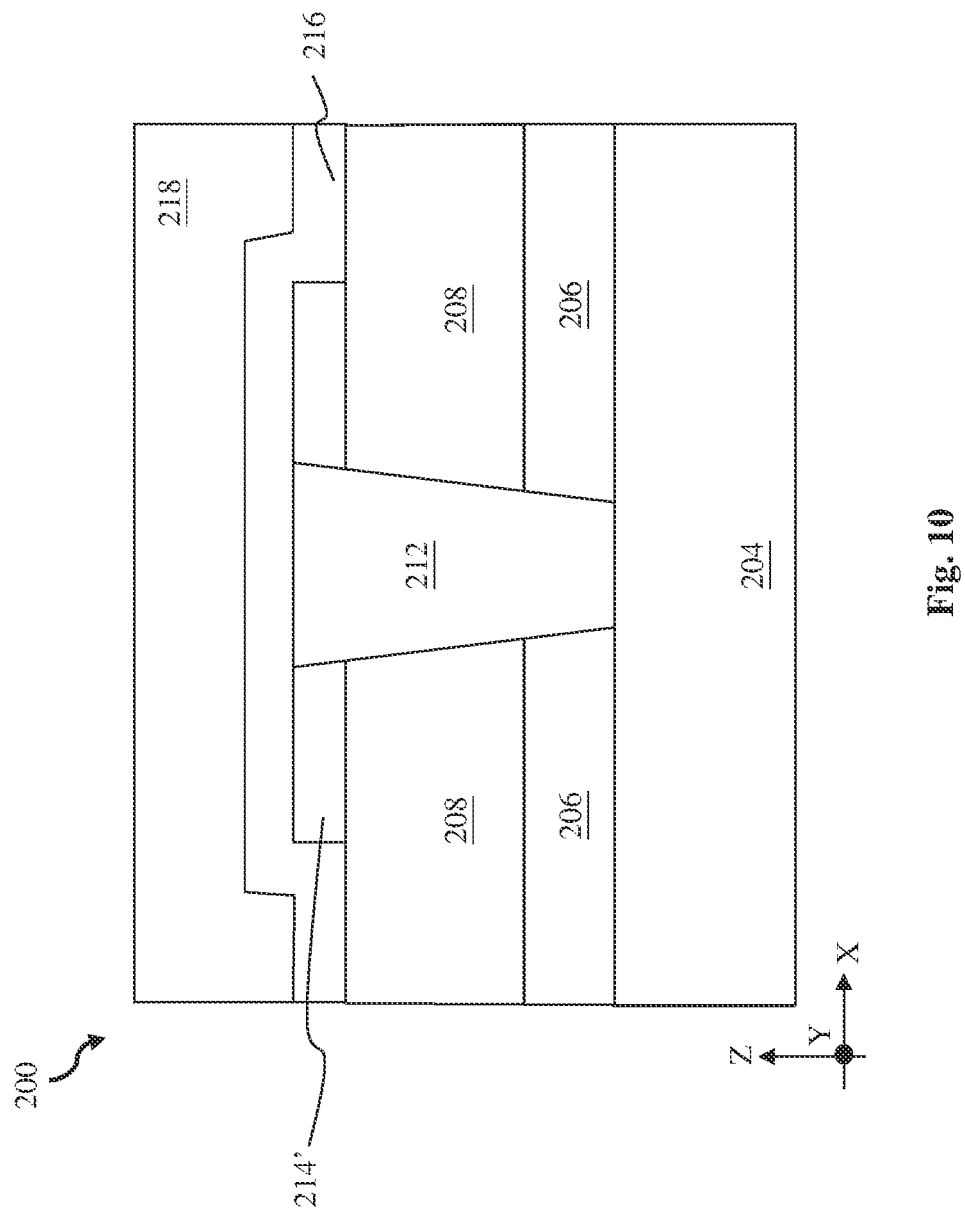

Referring to FIGS. 1 and 10, the method 100 includes a block 116, where a second dielectric layer 218 is deposited over the etch stop layer (ESL) 216. The second dielectric layer 218 is deposited over the etch stop layer 216 and is planarized to provide a planar top surface for further processing. In some instances, the second dielectric layer 218 is an interlayer dielectric layer (ILD) or is one of the interlayer dielectric layers. The second dielectric layer 218 may be formed of silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, California), Xerogel, Aerogel, amorphous fluorinated carbon, Parylene, BCB, SiLK (Dow Chemical, Midland, Michigan), polyimide, other low-k dielectric material, or combinations thereof. In some embodiments, the composition of the second dielectric layer 218 is different from the composition of the etch stop layer 216 such that the etch stop layer 216 is able to slow down a subsequent etching process and provide control to such process. In some embodiments, the second dielectric layer 218 may be formed by flowable CVD (FCVD) or spin-on coating.

Figure 11:
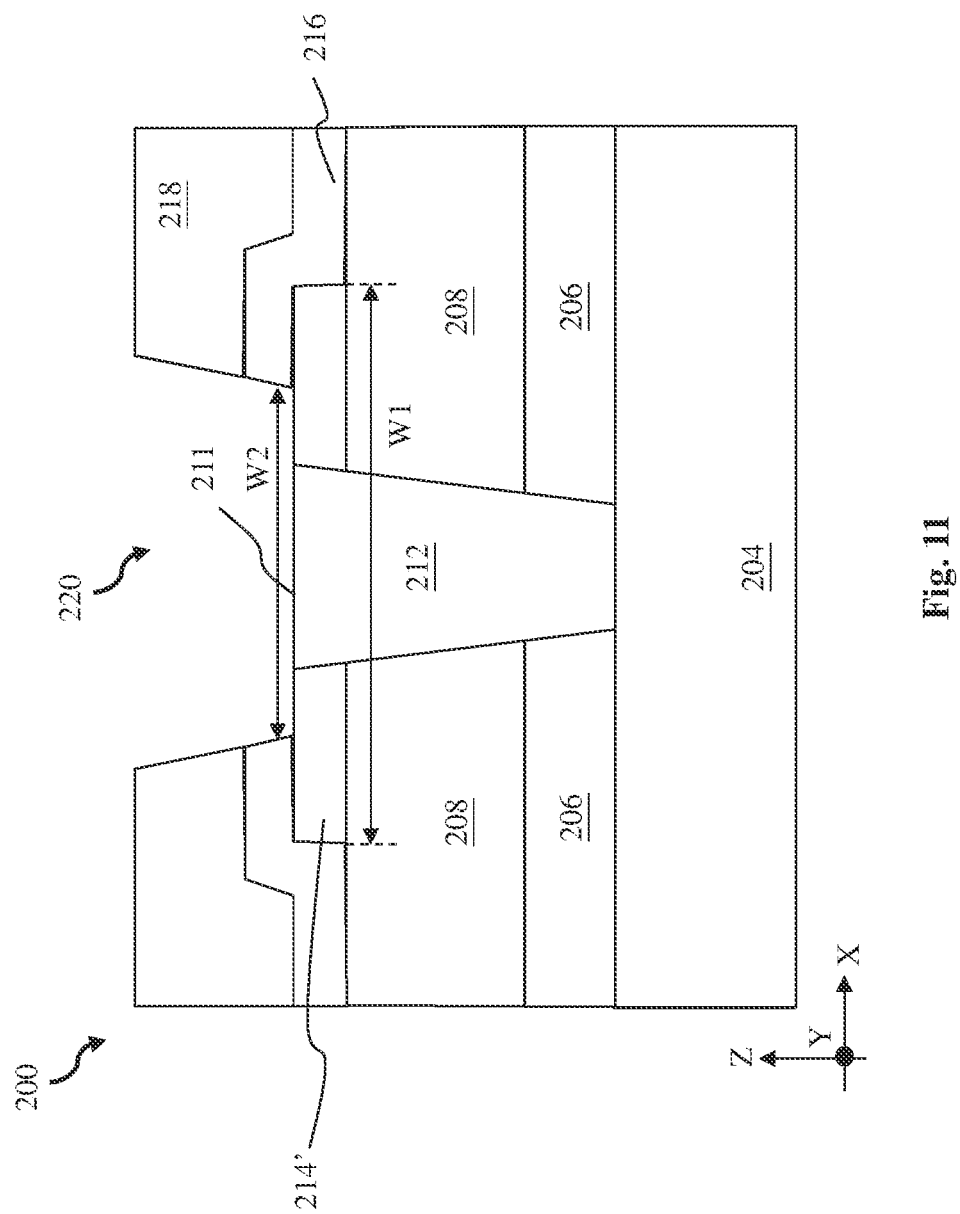

Referring to FIGS. 1 and 11, the method 100 includes a block 118 where a trench 220 is formed through the etch stop layer (ESL) 216 and the second dielectric layer 218 to expose the contact via 212. In some embodiments, photolithography techniques and anisotropic etching may be used to form the trench 220. For example, a single-layer or a multilayer hard mask may be first formed over the top surface of the second dielectric layer 218. Then the one or more photoresist layer may be deposited over the hard mask. The one or more photoresist layer may be then exposed to a patterned radiation reflected from or pass through a photolithography mask. After a post-exposure bake process, the exposed/unexposed portion of the photoresist layer may be removed in a developing process to form a patterned photoresist layer. The hard mask is then etched using the patterned photoresist layer as an etch mask to form a patterned hard mask. The second dielectric layer 218 and the etch stop layer 216 may then be anisotropically etched using the patterned hard mask as an etch mask to form the trench 220 as shown in FIG. 11. In some embodiments, the anisotropic etch process may be a dry etch process, a wet etch process, or a suitable etch process. An example of the dry etch process may be a reactive ion etching (ME) process. The top surface 211 of the contact via 212 is exposed at the bottom of the trench 220. In some implementations represented in FIG. 11, the patterned barrier layer 214' has a first width W1 along the X direction and the trench 220 has a second width W2 at the bottom of the trench 220. The first width W1 is greater than the second width W2. As a result, in these implementations, portions of the patterned barrier layer 214' are disposed between the first dielectric layer 208 and the etch stop layer 216.

Figure 12:
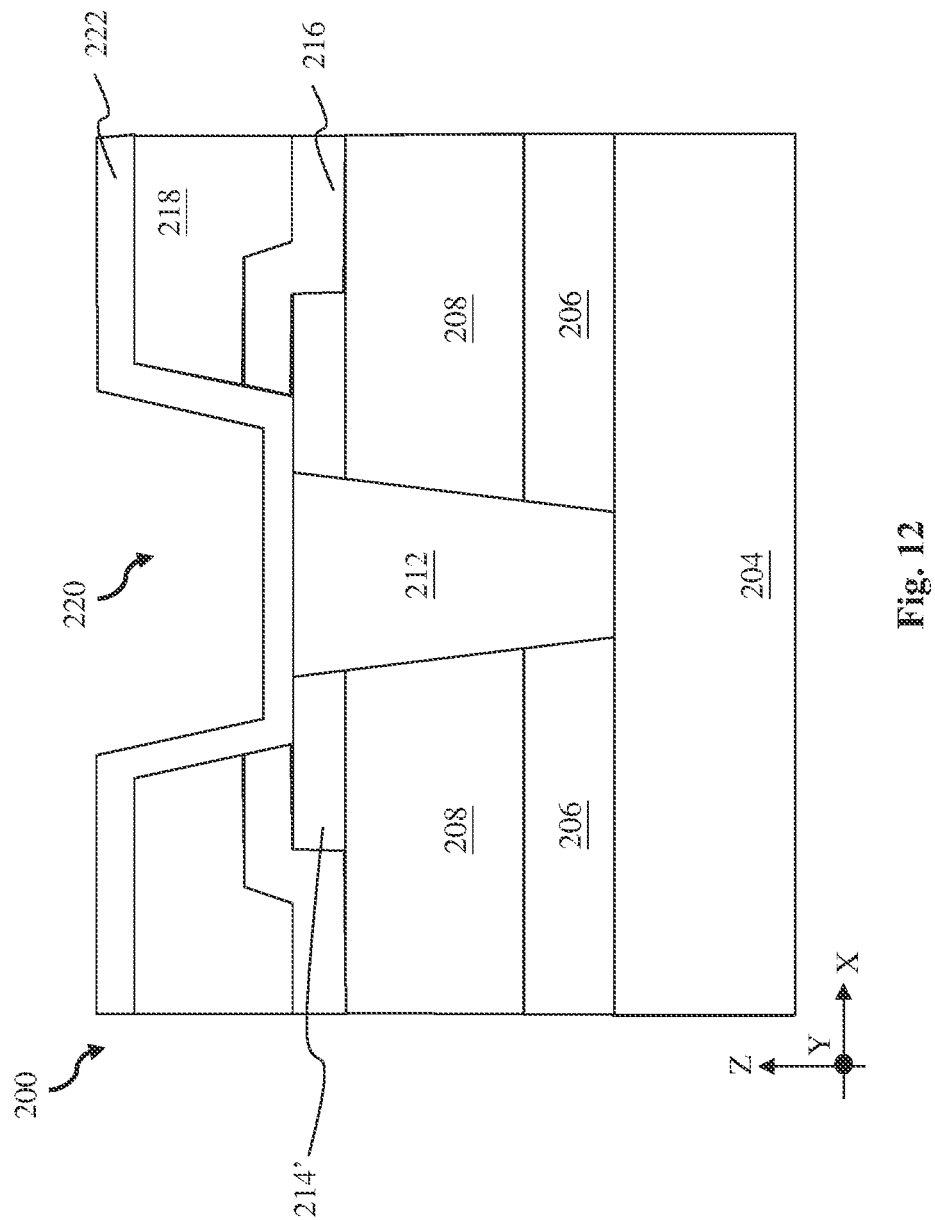

Referring to FIGS. 1 and 12, the method 100 includes a block 120 where a barrier spacer layer 222 is deposited over the workpiece 200. In some embodiments, the barrier spacer layer 222 may be deposited using CVD or ALD. The barrier spacer layer 222 may be formed of a metal, a metal nitride or a metal carbide, such as tantalum, tantalum nitride, tantalum carbide, titanium, titanium nitride, or titanium carbide, or a combination thereof. In some instances, the barrier spacer layer 222 may consist essentially of tantalum nitride. In some embodiments, the barrier spacer layer 222 is deposited conformally along sidewalls of the trench 220 and the top surface of the second dielectric layer 218.

Figure 13:
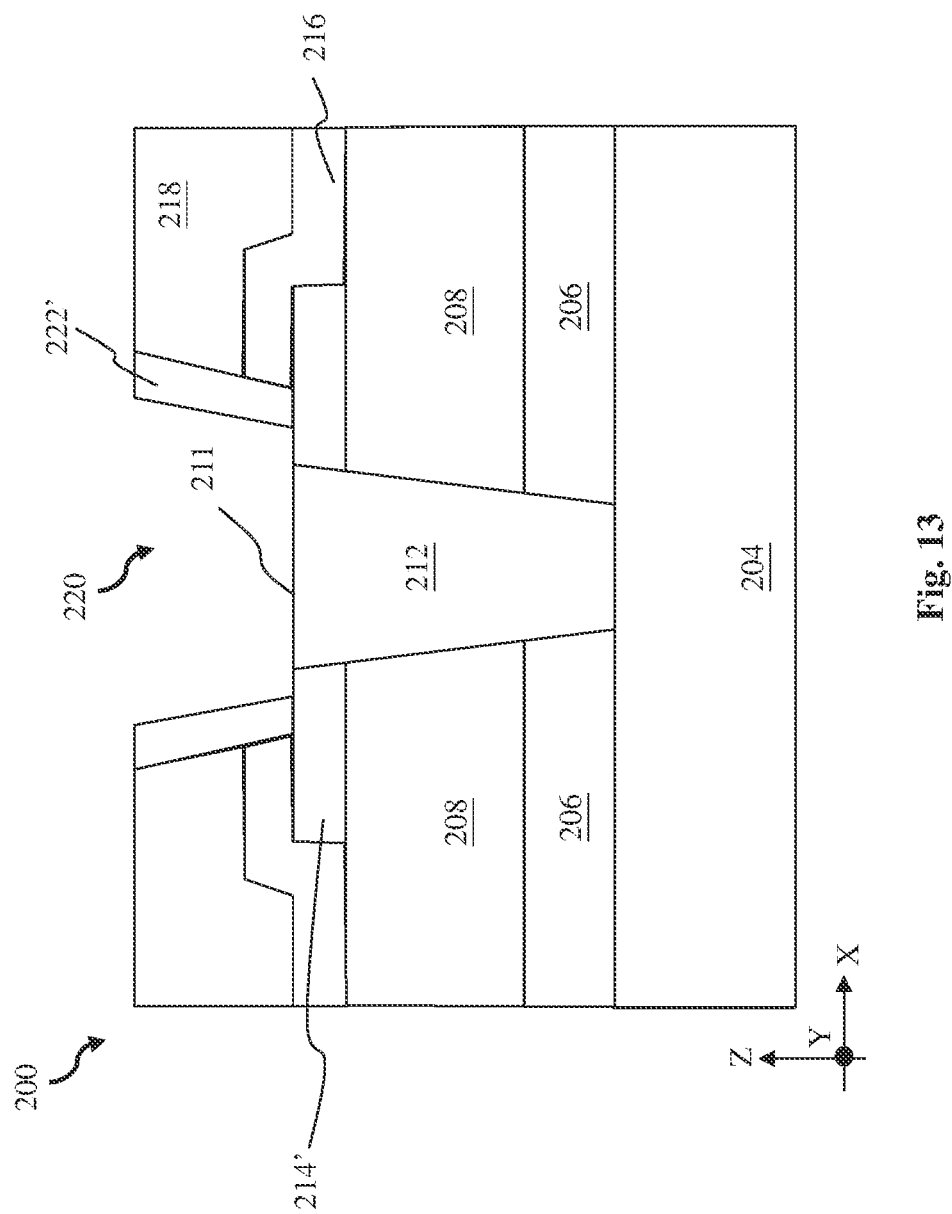

Referring to FIGS. 1 and 13, the method 100 includes a block 122 where the barrier spacer layer 222 is etched back to expose the contact via 212. In some embodiments, the barrier spacer layer 222 may be anisotropically etched back by a dry etch process, a wet etch process, or a suitable etch process. In these embodiments, block 122 may remove the barrier spacer layer 222 is from the top surface 211 of the contact via 212 and from the top surface of the second dielectric layer 218, thereby forming barrier spacers 222'. As shown in FIG. 13, the barrier spacers 222' line the sidewalls of the trench 220 and are in direct contact with the patterned barrier layer 214'. In embodiments represented in FIG. 13, the barrier spacers 222' include a second thickness T2 between about 1 nm and 5 nm. As the barrier spacers 222' have a resistance higher than that of the contact via 212, reducing the second thickness T2 lowers resistance of the contact via 212. At the same time, the second thickness T2 may not be reduced below the foregoing thickness range or there may not be sufficient barrier spacers 222' to block oxygen diffusion into the contact via 212 or metal diffusion from the contact via 212.

Figure 14:
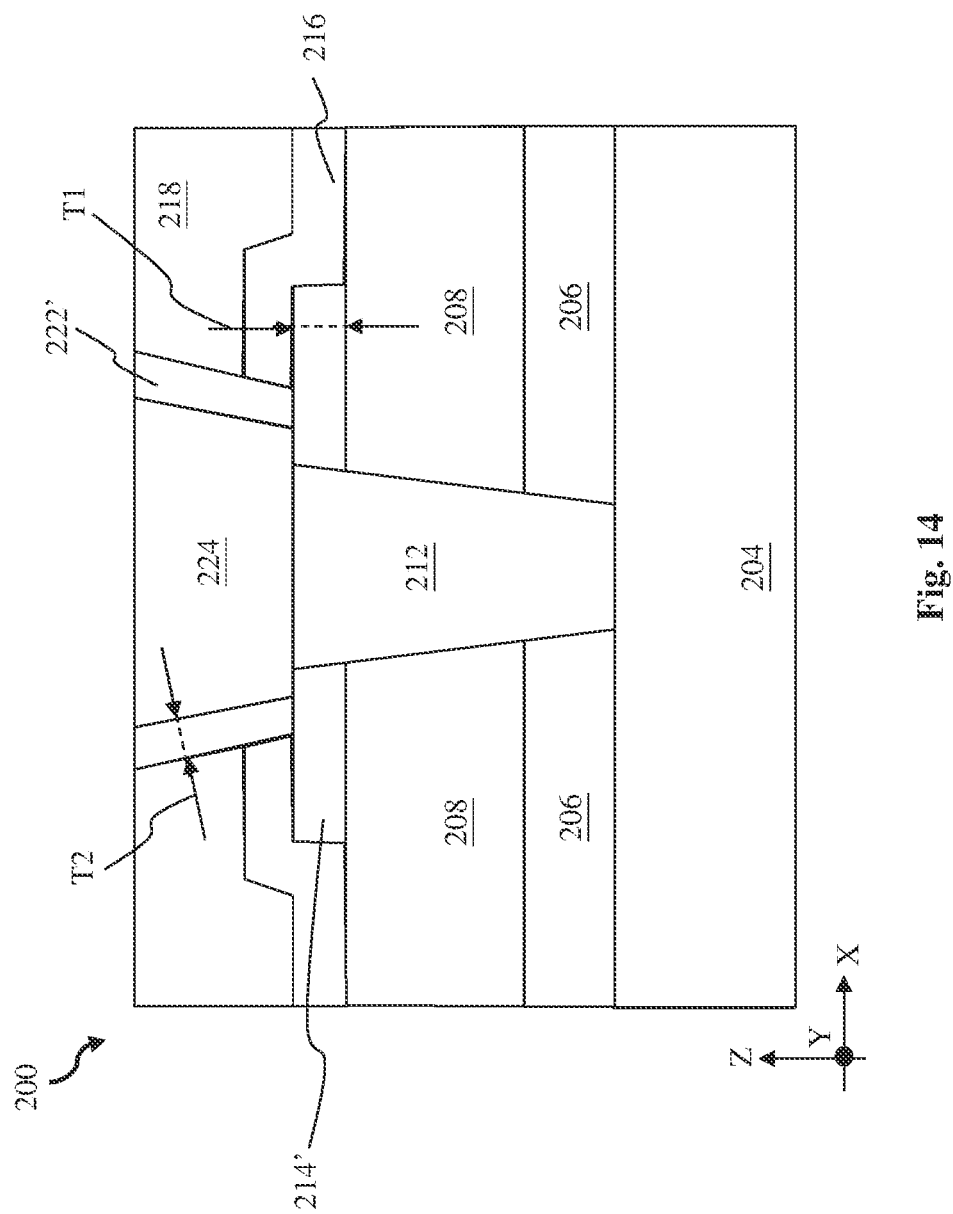

Referring to FIGS. 1 and 14, the method 100 includes a block 124 where a conductive feature 224 is formed in the trench 220. In some implementations, a metal fill material for the conductive feature 224 may be deposited in the trench 220 using physical vapor deposition (PVD), chemical vapor deposition (CVD), atomic layer deposition (ALD), electroplating, electroless deposition (ELD) or other suitable deposition process, or combinations thereof. The metal fill material for the conductive feature 224 may be formed of tungsten, ruthenium, nickel, cobalt, copper, aluminum, or a combination thereof. In some instances, the workpiece 200 is planarized to provide a planar top surface for further processes. The conductive feature 224 may be a metal line or a conductive line that may extend along the Y direction. Because the conductive feature 224 extends along a direction parallel to a surface of the workpiece 200 to electrically couple different features spread out along that direction, the conductive feature 224 is a horizontal interconnect structure and may be referred to as a horizontal interconnect structure 224. It is noted that as the barrier spacers 222' and the patterned barrier layer 214' surround and isolate the conductive feature 224 from the second dielectric layer 218, the etch stop layer 216, and the first dielectric layer 208. This arrangement prevents copper diffusion into adjacent regions and allows use of highly conductive copper for conductive feature 224. Copper diffusion may result in leakage and defects and conventional barrier-free structures often avoid use of copper as they do not include sufficient barrier layers/spacers to isolate the copper conductive features.

Figure 15:
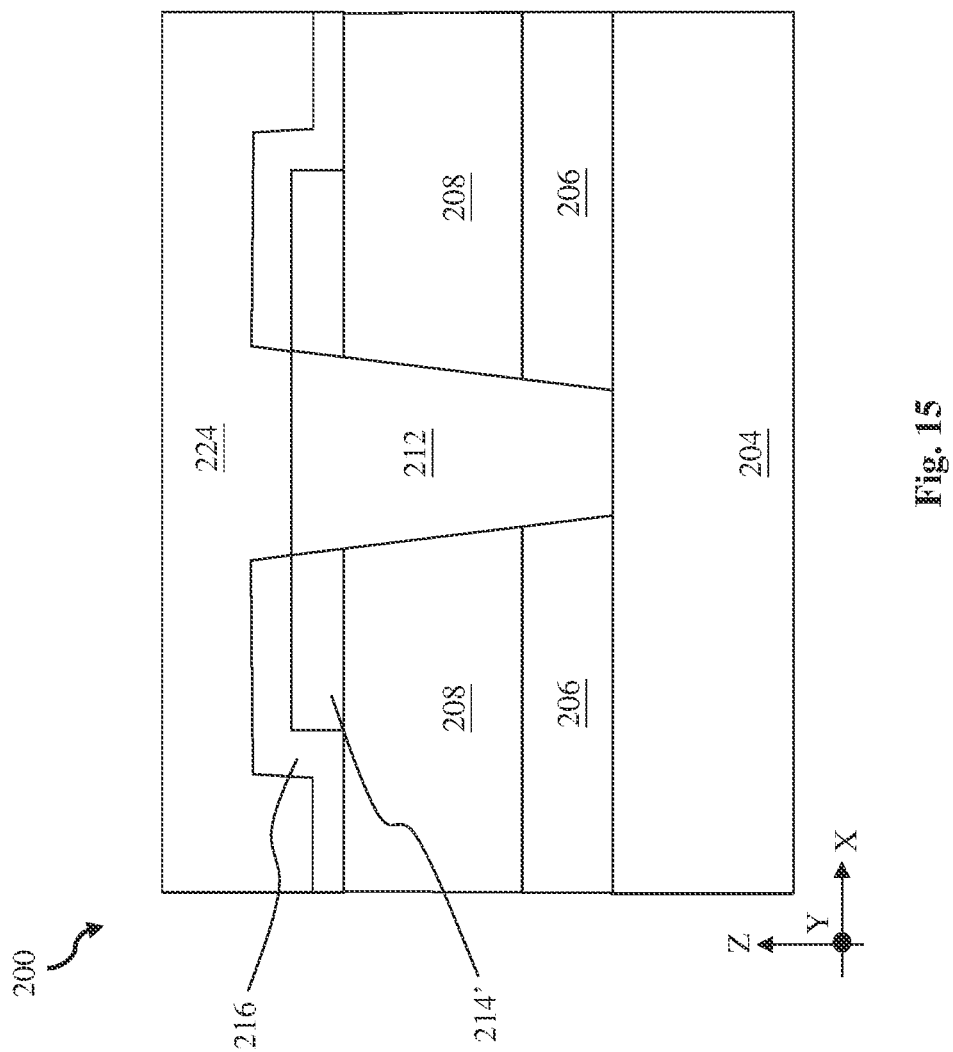
Figure 16:
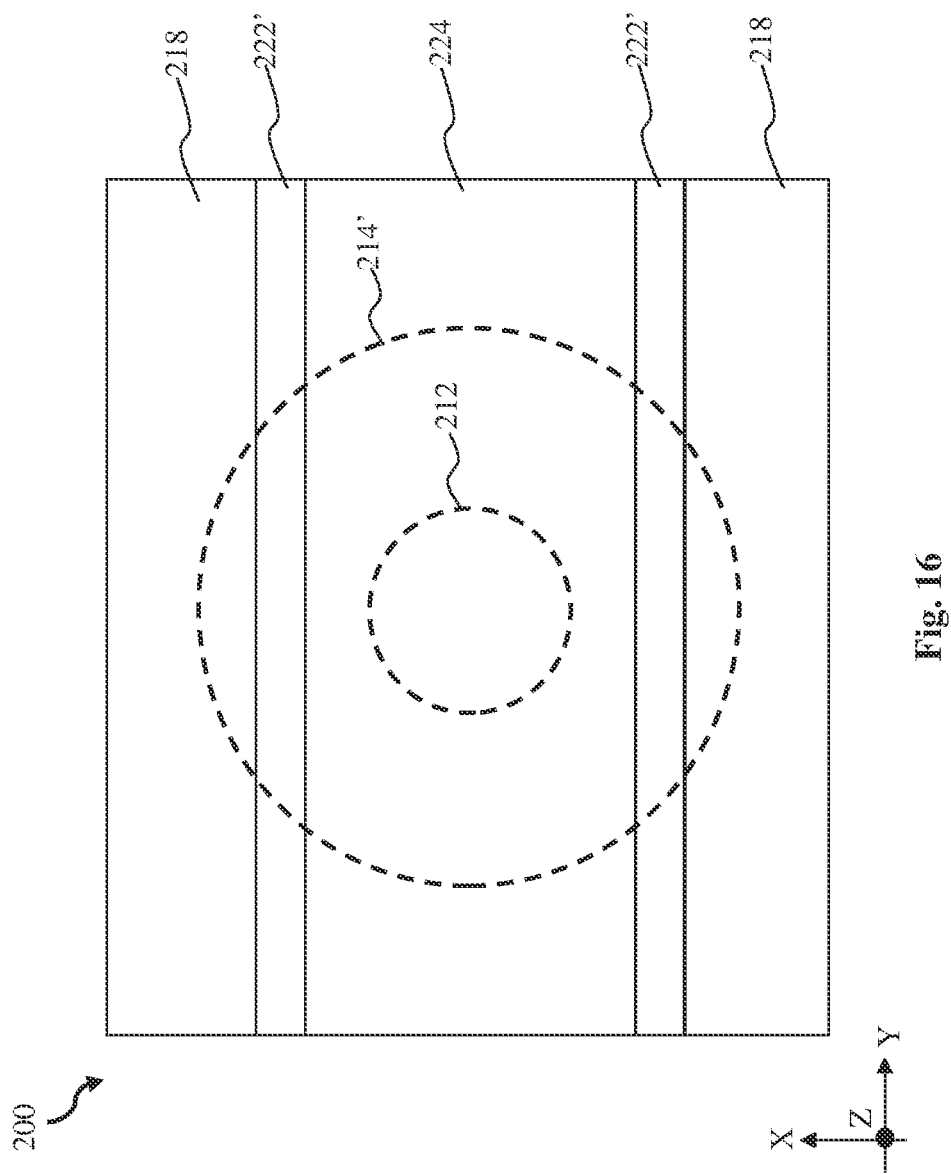

FIG. 15 illustrates a cross-sectional view of the workpiece 200 at the contact via 212 along a direction perpendicular to the direction of the cross-sectional view in FIG. 14. As the cross section goes right through the center of the contact via 212, the sidewall of the conductive feature 224 and the barrier spacers 222' are not shown in FIG. 15. In some instances, the conductive feature 224 is separated from the first dielectric layer 208 by the etch stop layer 216. FIG. 16 illustrates a top view of the workpiece 200. In some embodiments, the contact via 212 and the patterned barrier layer 214' are substantially circular in shape and the conductive feature 224 spans across and is electrically coupled to the contact via 212.

Referring to FIG. 1, the method 100 includes a block 126 where further processes are performed to complete the semiconductor device 200. In some embodiments, such further processes may include formation of further interlayer dielectric (ILD) layers, further contact vias, and further metal lines. Such further ILD layers, contact vias and metal lines, along with the contact via 212 and the conductive feature 224, constitute an interconnect structure that interconnect various passive devices and active devices in the semiconductor device 200.

The semiconductor devices, interconnect structures, contact vias and method disclosed herein provide several benefits. A semiconductor device according to the present disclosure includes a contact via and conductive feature over and in contact with the contact via. A barrier layer is disposed over a first dielectric layer and the contact via extends through both the first dielectric layer and the barrier layer. The contact via therefore includes a top surface that rises above a top surface of the first dielectric layer and is level with a barrier layer. The semiconductive device further includes an etch stop layer over the barrier layer and a second dielectric layer over the etch stop layer. The conductive feature extends through both the etch stop layer and the second dielectric layer to be in contact with the contact via. The barrier layer has a first width W1 greater than a second width W2 of the conductive feature. Therefore, a portion of the barrier layer extends between the second dielectric layer and the etch stop layer. A barrier spacer layer is disposed between the conductive feature, on the one hand, and the etch stop layer and the second dielectric layer, on the other hand. This arrangement allows the contact via to be in direct contact with the conductive feature thereover for reduced parasitic resistance and the conductive feature is surrounded by the barrier layer and the barrier spacer to guard against unwanted diffusion.

The present disclosure provides for many different embodiments. In one embodiment, a semiconductor device is provided. The semiconductor device includes a first dielectric layer having a first top surface, and a vertical interconnect structure extending through the first dielectric layer and rising above the first top surface of the first dielectric layer.

In some embodiments, the semiconductor device further includes a barrier layer over the first dielectric layer. The barrier layer has a second top surface and the vertical interconnect structure extends through the barrier layer and includes a third top surface substantially level with the second top surface. In some implementations, the semiconductor device further includes an etch stop layer over the barrier layer, a second dielectric layer over the etch stop layer, and a horizontal interconnect structure extending through the etch stop layer and the second dielectric layer. In some instances, the barrier layer has a first width along the first top surface and the horizontal interconnect structure has a second width smaller than the first width. In some implementations, a portion of the barrier layer extends between first dielectric layer and the etch stop layer. In some implementations, the semiconductor device further includes a barrier spacer extending between the horizontal interconnect structure and the etch stop layer. In some embodiments, the barrier spacer extends between the horizontal interconnect structure and the second dielectric layer. In some instances, the barrier layer and the barrier spacer includes a nitrogen-containing material.

In another embodiment, a method is provided. The method includes forming a first dielectric layer over a contact feature, forming a contact via extending through the first dielectric layer and having a first top surface above a second top surface of the first dielectric layer, depositing a barrier layer over the first dielectric layer and the contact via, and planarizing the barrier layer to expose the first top surface of the contact via.

In some embodiments, the method further includes patterning the barrier layer to form a patterned barrier layer, depositing an etch stop layer over the barrier layer, depositing a second dielectric layer over the etch stop layer, and forming a trench through the second dielectric layer and the etch stop layer to expose the first top surface of the contact via. In some implementations, the method further includes depositing a barrier spacer layer over the trench, including over the first top surface of the contact via, and removing the barrier spacer layer over the first top surface of the contact via to form a barrier spacer. The barrier spacer is in contact with the barrier layer. In some embodiments, the patterned barrier layer has a first width along the first top surface of the first dielectric layer and the trench has a second width smaller than the first width. In some instances, where the forming of the contact via includes forming a via opening through the first dielectric layer, depositing a conductive material in the via opening to form the contact via, planarizing the contact via and the first dielectric layer, and selectively etching the first dielectric layer. In some instances, the forming of the contact via includes depositing a sacrificial layer over the first dielectric layer, forming a via opening through the first dielectric layer and the sacrificial layer, depositing a conductive material in the via opening to form the contact via, planarizing the contact via and the sacrificial layer, and removing the sacrificial layer. In some other instances, the forming of the contact via includes forming a via opening through the first dielectric layer to expose the contact feature, and selectively depositing a conductive material over the exposed contact feature to form the contact via. In those instances, the selectively depositing of the conductive material does not substantially deposit the conductive material over the second top surface of the first dielectric layer.

In still another embodiment, a method is provided. The method includes forming a metal etch stop layer over a contact feature, forming a first dielectric layer over the metal etch stop layer, forming a contact via extending through the metal etch stop layer and the first dielectric layer and having a first top surface above a second top surface of the first dielectric layer, depositing a barrier layer over the first dielectric layer and the contact via, planarizing the barrier layer to expose the first top surface of the contact via, depositing an etch stop layer over the barrier layer, depositing a second dielectric layer over the etch stop layer, forming a trench through the etch stop layer and the second dielectric layer to expose the first top surface of the contact via, and depositing a conductive feature in the trench.

In some embodiments, the method further includes before the depositing of the conductive feature, depositing a barrier spacer layer over the second dielectric layer and the trench, and etching back the barrier spacer layer to form a barrier spacer and to expose the first top surface of the contact via. In some implementations, the contact via includes tungsten or ruthenium, the conductive feature includes copper, and the barrier layer and the barrier spacer comprise tantalum nitride. In some embodiments, the forming of the contact via includes forming a via opening through the metal etch stop layer and the first dielectric layer to expose the contact feature, and selectively depositing a conductive material over the exposed contact feature to form the contact via. In those embodiments, the selectively depositing of the conductive material does not substantially deposit the conductive material over the second top surface of the first dielectric layer. In some instances, the forming of the contact via includes forming a via opening through the metal etch stop layer and the first dielectric layer, depositing a conductive material in the via opening to form the contact via, planarizing the contact via and the first dielectric layer, and selectively etching the first dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a first dielectric layer over a contact feature using flowable chemical vapor deposition (FCVD) or spin-on coating, the first dielectric layer comprising a first top surface;
forming a contact via extending through the first dielectric layer and having a second top surface above the first top surface of the first dielectric layer;
depositing a barrier layer over the first dielectric layer and the contact via;
planarizing the barrier layer by chemical mechanical polishing to expose the first top surface of the contact via while the first dielectric layer remains covered by the barrier layer; and
after the planarizing, patterning the barrier layer to form a patterned barrier layer and expose a portion of the first dielectric layer.

2. The method of claim 1, further comprising:
depositing an etch stop layer over the patterned barrier layer and the portion of the first dielectric layer;
depositing a second dielectric layer over the etch stop layer; and
forming a trench through the second dielectric layer and the etch stop layer to expose the first top surface of the contact via.

3. The method of claim 2, further comprising:
depositing a barrier spacer layer over the trench, including over the second top surface of the contact via; and
removing the barrier spacer layer over the second top surface of the contact via to form a barrier spacer,
wherein the barrier spacer is in contact with the barrier layer.

4. The method of claim 2, wherein the patterned barrier layer has a first width and the trench has a second width smaller than the first width.

5. The method of claim 1, where the forming of the contact via comprises:
forming a via opening through the first dielectric layer;
depositing a conductive material in the via opening to form the contact via;
planarizing the contact via and the first dielectric layer; and
selectively etching back the first dielectric layer.

6. The method of claim 1, wherein the forming of the contact via comprises:
depositing a sacrificial layer over the first dielectric layer;
forming a via opening through the first dielectric layer and the sacrificial layer;
depositing a conductive material in the via opening to form the contact via;
planarizing the contact via and the sacrificial layer; and
removing the sacrificial layer.

7. The method of claim 6, wherein a composition of the sacrificial layer is different from a composition of the first dielectric layer.

8. The method of claim 6, wherein the second top surface comprises a convex top surface.

9. The method of claim 1, wherein the forming of the contact via comprises:
forming a via opening through the first dielectric layer to expose the contact feature; and
selectively depositing a conductive material over the exposed contact feature to form the contact via,
wherein the selectively depositing of the conductive material does not substantially deposit the conductive material over the first top surface of the first dielectric layer.

10. A method, comprising:
forming a metal etch stop layer over a contact feature;
forming a first dielectric layer over the metal etch stop layer;
forming a contact via extending through the metal etch stop layer and the first dielectric layer and having a first top surface above a second top surface of the first dielectric layer;
depositing a barrier layer over the first dielectric layer and the contact via;
planarizing the barrier layer to expose the first top surface of the contact via;
depositing an etch stop layer over the barrier layer;
depositing a second dielectric layer over the etch stop layer;
forming a trench through the etch stop layer and the second dielectric layer to expose the first top surface of the contact via; and
depositing a conductive feature in the trench.

11. The method of claim 10, further comprising:
before the depositing of the conductive feature, depositing a barrier spacer layer over the second dielectric layer and the trench; and
etching back the barrier spacer layer to form a barrier spacer and to expose the first top surface of the contact via.

12. The method of claim 11,
wherein the contact via comprises tungsten or ruthenium,
wherein the conductive feature comprises copper,
wherein the barrier layer and the barrier spacer comprise tantalum nitride.

13. The method of claim 10, further comprising:
before the depositing of the etch stop layer, patterning the barrier layer to expose a portion of the first dielectric layer.

14. The method of claim 13, wherein the etch stop layer is in direct contact with sidewalls of the patterned barrier layer.

15. The method of claim 10, wherein the forming of the contact via comprises:
forming a via opening through the metal etch stop layer and the first dielectric layer to expose the contact feature; and
selectively depositing a conductive material over the exposed contact feature to form the contact via,
wherein the selectively depositing of the conductive material does not substantially deposit the conductive material over the second top surface of the first dielectric layer.

16. The method of claim 10, where the forming of the contact via comprises:
forming a via opening through the metal etch stop layer and the first dielectric layer;
depositing a conductive material in the via opening to form the contact via;
planarizing the contact via and the first dielectric layer; and
selectively etching back the first dielectric layer.

17. A method, comprising:
receiving a workpiece comprising:
a first etch stop layer, and
a first dielectric layer over the first etch stop layer;
forming a via opening through the first etch stop layer and the first dielectric layer along a vertical direction;
forming a contact via in the via opening such that a top surface of the contact via rises above a top surface of the first dielectric layer;

depositing a barrier layer over the first dielectric layer and the contact via;

planarizing the barrier layer to expose the top surface of the contact via;

patterning the planarized barrier layer such that the patterned barrier layer comprises a circular shape when viewed along the vertical direction;

depositing a second etch stop layer over the patterned barrier layer;

depositing a second dielectric layer over the second etch stop layer;

forming a trench through the etch stop layer and the second dielectric layer to expose the top surface of the contact via and a portion of the second etch stop layer; and depositing a conductive feature in the trench.

18. The method of claim 17, wherein the conductive feature spans over the second etch stop layer, the barrier layer, and the top surface of the contact via.

19. The method of claim 17, further comprising:

before the depositing of the conductive feature, depositing a barrier spacer layer over the trench, including over the second dielectric layer; and etching back the barrier spacer layer to expose the top surface of the contact via and to form a barrier spacer in contact with the second etch stop layer and the second dielectric layer.

20. The method of claim 19, wherein, after the etching back, a portion of the barrier layer is exposed in the trench.

\* \* \* \* \*